United States Patent [19]

Sexton et al.

[11] Patent Number: 5,688,715
[45] Date of Patent: Nov. 18, 1997

[54] EXCIMER LASER DOPANT ACTIVATION OF BACKSIDE ILLUMINATED CCD'S

[75] Inventors: Douglas A. Sexton; Stephen D. Russell; Ronald E. Reedy, all of San Diego; Eugene P. Kelley, Spring Valley, all of Calif.

[73] Assignee: The United States of America as represented by the Secretary of the Navy, Washington, D.C.

[21] Appl. No.: 514,922

[22] Filed: Aug. 14, 1995

Related U.S. Application Data

[63] Continuation of Ser. No. 171,326, Dec. 21, 1993, abandoned, which is a continuation of Ser. No. 591,930, Oct. 2, 1990, abandoned, which is a continuation-in-part of Ser. No. 501,707, Mar. 29, 1990, Pat. No. 5,385,633, and a continuation-in-part of Ser. No. 508,317, Apr. 10, 1990, Pat. No. 5,354,420.

[51] Int. Cl.$^6$ ............................................... H01L 21/263
[52] U.S. Cl. ............................................. 437/173; 437/174
[58] Field of Search ........................... 437/173, 174; 148/DIG. 93, DIG. 94

[56] References Cited

U.S. PATENT DOCUMENTS

| | | |
|---|---|---|
| 4,422,091 | 12/1983 | Liu . |
| 4,436,557 | 3/1984 | Wood et al. ................. 437/2 |
| 4,641,963 | 2/1987 | Levine . |
| 4,656,519 | 4/1987 | Savoye . |
| 4,674,176 | 6/1987 | Tuckerman ................. 437/173 |
| 4,716,447 | 12/1987 | Savoye . |
| 4,760,031 | 7/1988 | Janesick . |
| 4,774,557 | 9/1988 | Kosonocky . |
| 4,932,747 | 6/1990 | Russell et al. ............. 219/121.6 |

OTHER PUBLICATIONS

Wolf & Tauber; *Silicon Processing for the VLSI Era vol. 1: Process Technology;* Lattice Press, Sunset Beach, CA (1986) pp. 308–309.

P. G. Carey et al., "A Shallow Junction Submicrometer PMOS Process Without High–Temperature Anneals", *IEEE Electron Device Letters,* vol. 9, No. 10, Oct. 1988, pp. 542–544.

S.D. Russell, et al "Bipolar Transistors in Silicon–On–Sapphire (SOS):Effects of Nanosecond Thermal Processing," IEEE Sos/SoI Technology Conference Proceedings (1990).

C. Tassin, et al "Thinned Backside Illuminated cCDs for Ultraviolet Imaging" SPIE vol. 932, *Ultraviolet Technology II* pp. 305–310 (1988).

R.A. Stern, et al "Ultraviolet and Extreme Ultraviolet Response of Charge–Coupled–Device Detectors" Optical Engineering 26 pp. 875–883 (1987).

(List continued on next page.)

*Primary Examiner*—Robert Kunemund
*Attorney, Agent, or Firm*—Harvey Fendelman; Thomas Glenn Keough; Eric James Whitesell

[57] ABSTRACT

A method uses an excimer laser to activate previously implanted dopant species in the backside of a backside-illuminated CCD or to incorporate dopant ions from a gaseous ambient into the backside of a backside-illuminated CCD and simultaneously activate. The controlled ion implantation of the backside and subsequent thin layer heating by the short wavelength pulsed excimer laser energy activates the dopant and provides for an improved dark current response and improved spectral response. The energy of the pulsed excimer laser is applied uniformly across a backside-illuminated CCD in a very thin layer of the semiconductor substrate (usually silicon) material that requires annealing to uniformly activate the dopant. The very thin layer of the material can be heated to exceedingly high temperatures on a nanosecond time scale while the bulk of the delicate CCD substrate remains at low temperature. Repair of semiconductor dies by effecting a uniform annealing enables salvage and utilization of otherwise discardable components by bringing their dark current response to within an acceptable range.

5 Claims, 4 Drawing Sheets

OTHER PUBLICATIONS

H. Ryssel, et al Ion Implantution (New York, John Wiley & Sons 1986), p. 248.

J.R. Janesick, et al "Flash Technology for Charge–Coupled–Device Imaging in the Ultraviolet" Optical Engineering 26 pp. 852–863 (1987).

A.E. Bell, "Review and Analysis of Laser Annealing" RCA Review 40 pp. 295–338 (1979).

K.H. Weiner, et al "Thin–Base Bipolar Transistor Fabrication Using Gas Immersion Laser Doping" IEEE Electron Dev. Lett 10 pp. 260–263 (1989).

EXCIMER LASER DOPANT ACTIVATION OF BACKSIDE ILLUMINATED CCD'S

This application is a continuation of Ser. No. 08/171,326 filed Dec. 21, 1993, now abandoned which is a continuation of Ser. No. 07/591,930, filed Oct. 2, 1990, now abandoned, which is a continuation in part of Ser. No. 07/501,707, filed Mar. 29, 1990, now U.S. Pat. No. 5,385,633 and a continuation in part of Ser. No. 07/508,317, filed Apr. 10, 1990, now U.S. Pat. No. 5,354,420.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A number of image-gathering detectors use charge coupled devices (CCDs) with varying degrees of sensitivity and resolution. CCDs are solid state electronic imaging devices which read out image charges from wells in an array of pixels. CCDs designed for solid-state cameras, such as camcorders, are in great demand and are widely available. They have been designed to provide adequate performance when viewing brightly illuminated scenes. However, in astronomical, scientific and military applications their spectral response, readout noise, dark current, full well-capacity and other characteristics are not satisfactory.

To overcome the limitations of imaging through the polysilicon gates that necessarily cover all of the sensitive pixel array, it would be desirable to illuminate the CCD from the backside if the substrate were thin enough. In other words, a solution to obtaining better light sensitivity would be the thinning of the backside of the CCD to a total thickness of roughly 10 microns and illumination from the backside.

Figure 1:
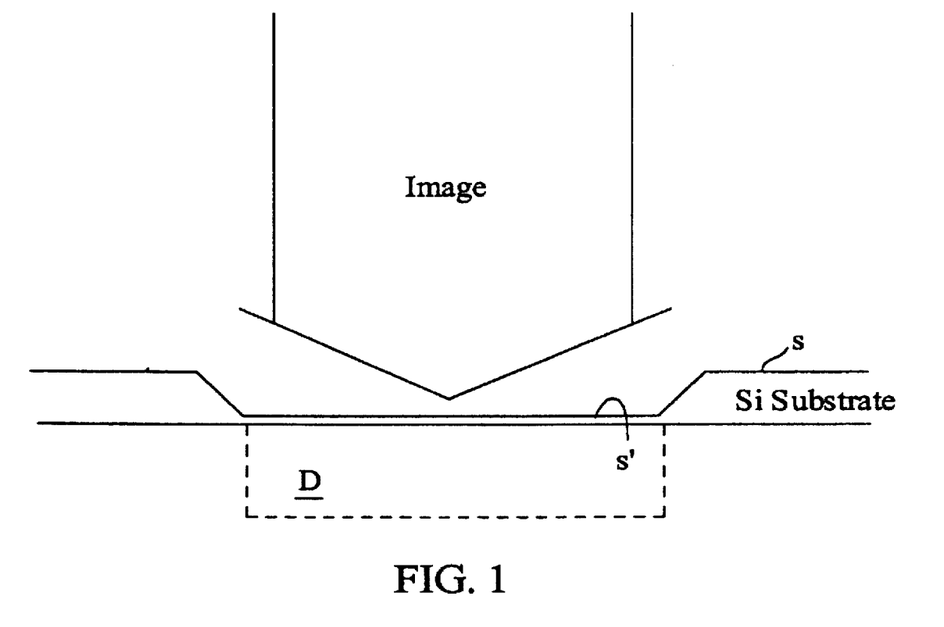
FIG. 1 is a cross-sectional schematic depiction of a backside-illuminated CCD array.

Noting FIG. 1 which schematically shows the relevant portions of a typical backside-illuminated CCD array with a semiconductor substrate S, usually silicon, so that its thin cross-section S' allows more radiation to reach its detector array D. The thinning technique has been, at least, partially successful since if the silicon substrate upon which the array resides is made thin enough to permit short-wavelength light (blue and ultraviolet) to penetrate into the active regions of the device, it is possible to obtain CCDs with improved spectral response. Still, the need for improvements remain.

In order to realize superior spectral response and dark current characteristics, the backside of these detectors must be doped $p^+$. This is normally accomplished by ion implantation of the backside and subsequent heating to activate the dopant. Initially, only a fraction of the implanted dopant atoms reside in locations in the crystal lattice which are electrically active. Thermal energy is provided to permit the migration of dopant atoms into active sites. The obstacle that must be overcome by fabricators when this approach is relied on is that the backside doping process (and heating) occurs after all frontside device fabrication. A large temperature elevation of the frontside circuitry at this point in the process can cause deleterious effects. For example, backside doping of a silicon substrate with boron has been done to enhance the spectral response and suppress the dark current of CCD detectors. Boron implantation is normally followed by a thermal anneal at 1000° C. for thirty minutes. But temperatures above about 750° C. can cause shifts in transistor threshold and contact resistance values in prior fabrication steps, and temperatures exceeding about 400° C. damage metal layers in a device. Since the final implant occurs after all frontside device fabrication, the anneal temperature is restricted to 400° C. At this temperature, boron doses of approximately $10^{13}$ ions/cm$^2$ have only 10 to 20% of the dopants activated.

Figure 2:
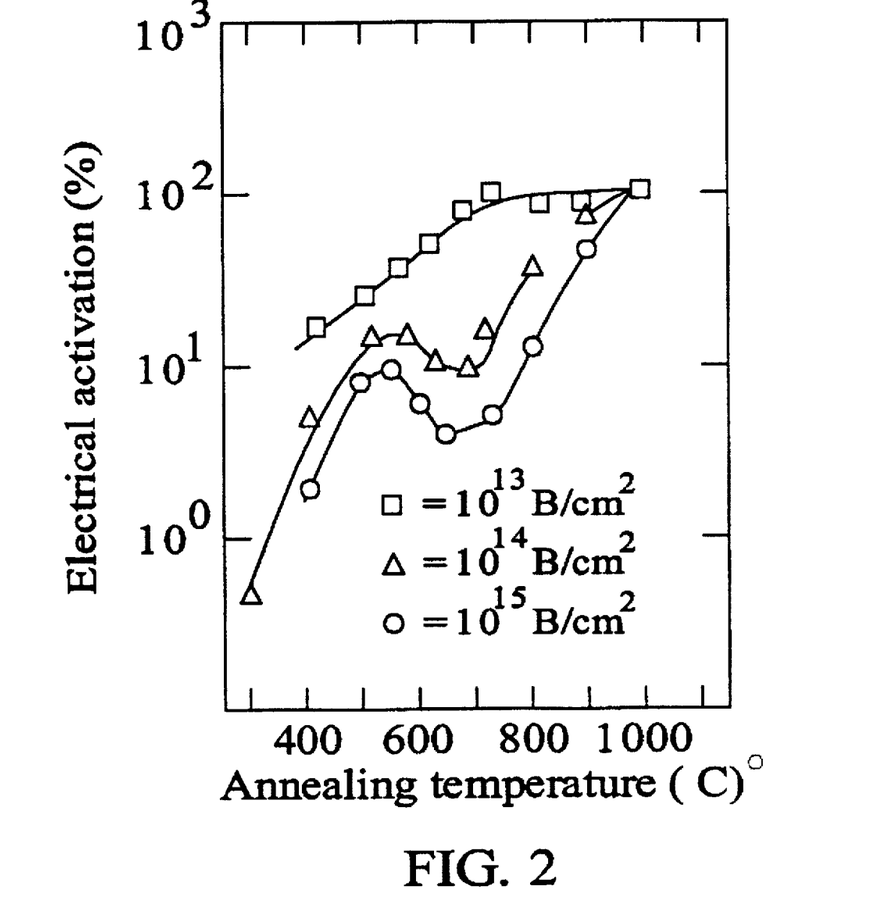
FIG. 2 shows the relative increase in electrical activation as a function of annealing temperature for boron implant doses of $10^{13}$ ions/cm$^2$, $10^{14}$ ions/cm$^2$ and $10^{15}$ ions/cm$^2$.

FIG. 2 shows the relative increase in electrical activation as a function of annealing temperature of boron in silicon as reported in H. Ryssel, I. Ruge, *Ion Implantation*, (New York, John Wiley & Sons, 1986), page 248. As the implant dosage increases, the silicon crystal becomes more damaged and the percentage activation decreases. The consequence is that frequency response is affected and dark current can rise to objectionable levels. As a result of this, research and development into a variety of techniques to overcome this problem and improve CCD device performance is active.

U.S. Pat. No. 4,422,091 by Liu entitled "Backside Illuminated Imaging Charge Coupled Device", U.S. Pat. No. 4,716,447 by Savoye entitled "Interrupting Charge Integration in Semiconductor Imagers Exposed to Radiant Energy", and U.S. Pat. No. 4,641,963 by Levine entitled "Back-Illuminated CCD Imager Adapted for Contrast Transfer Function Measurements Thereon" are examples of state-of-the-art backside illuminated CCDs. These are not designed for low dark current with defect free pixels, enhanced blue response nor is there a method to achieve these properties as described herein. U.S. Pat. No. 4,774,557 by Kosonocky entitled "Back-Illuminated Semiconductor Imager with Charge Transfer Devices in Front Surface Well Structure", and U.S. Pat. No. 4,760,031 by Janesick entitled "Producing CCD Imaging Sensor with Flashed Backside Metal Film" are examples of CCDs that use a thin metal layer on the backside active area to improve the blue an UV response. These are representative of a alternative method for achieving enhanced responsivity to short wavelengths but are distinct from our method and process to achieve enhancement. The fabrication process used in these inventions are not applicable for repairing defective pixels and improving dark current as outline in our inventive concept. U.S. Pat. No. 4,656,519 by Savoye entitled "Back-Illuminated CCD Imagers of Interline Transfer Type" describe a method to reduce charge transfer smear in CCD imagers using deep highly doped implant regions near the CCD registers. The CCD described by Savoye uses a diffused p+ dopant on the backside layer to help forestall surface recombination of photogenerated charge carriers. Such a processing method can not achieve the shallow junctions desired for optimal performance at short wavelengths, nor repair defected pixels or improve dark current since only low temperature diffusions and anneals can be employed without damage to the remaining device.

J. R. Janesick, D. Campbell, T. Elliott, T. Daud in "Flash Technology for Charge-Coupled-Device Imaging in the Ultraviolet", Optical Engineering, 26, 852–863 (1987) report on the use of a "flash gate" for improved UV response. This is substantially the information described in the above discussed U.S. Pat. No. 4,760,031. The Jansick et al. paper reviews some of the physics of the back interface as it pertains to improved UV response. The article by A. E. Bell entitled "Review and Analysis of Laser Annealing", RCA Review, 40, 295–338 (1979) provides background information on laser annealing and reviews early results on laser activation of dopant. The articles by K. H. Weiner, T. W. Sigmon, "Thin-Base Bipolar Transistor Fabrication Using Gas Immersion Laser Doping", IEEE Electron Dev. Lett., 10, 260–263 (1989) and S. D. Russell, B. W. Offord, K. H. Weiner, "Bipolar Transistors in Silicon-On-Sapphire (SOS): Effects of Nanosecond Thermal Processing" in IEEE SOS/SOI Technology Conference Proceedings (1990) are representative of applications of laser processing in the fabrication of electronic devices.

It should be noted that laser processing to activate dopant either after ion implantation or through a laser-assisted decomposition from the gas phase has been long known in the field. Additional references have been reported on yearly since 1980 by the Materials Research Society Conferences. In view of that, the teachings of our invention have noted improvements to the prior art with a simple technique that combines several different advantages and an unexpected new results (that of improving dark current and repairing defective pixels) in a crowded field that is active in exploring device applications. This will become more apparent in view of the teachings disclosed herein.

C. Tassin, Y. Thenoz, J. Chabbal reported in their presentation at OPTO '88 in Paris, France (17–19 May 1988) and their paper entitled "Thinned Backside Illuminated CCDs for Ultraviolet Imaging", SPIE, Vol. 932, *Ultraviolet Technology II*, 305–310 (1988) of the use of a laser to perform backside annealing of ion implanted dopant to improve the blue response of backside illuminated CCDs. Substantial differences exist between their process and our invention. They report on boron implantation followed by the use of continuous wave (CW) illumination by an argon ion laser with subsequent chemical removal of part of the implant profile containing the maximum of the dopant distribution. Several features of the process of the invention disclosed and claimed herein offer significant improvements over their teachings:

(1) The invention disclosed herein uses photoincorporation of an doping ambient (such as boron trifluoride) as discussed later in our invention and is superior to the ion implantation technique for creating very shallow junctions and improved blue response; (2) The invention disclosed herein uses pulsed laser activation using an excimer laser that allows for nonlinear dynamics which can provide for supersaturated doping concentrations beyond the solid solubility limit which can improve responsivity; (3) The invention disclosed herein uses excimer laser activation with short UV wavelengths allows for very shallow p+ layer providing improved detection performance at UV and shorter wavelengths due in part to the shallow junction and due to the corresponding higher dopant concentration, (4) The invention disclosed herein provides for a uniform doping concentration thereby eliminating the extra processing steps involved in complex masking and chemical etching and handling of thin membranes to remove part of their laser processed material; (5) The invention disclosed herein does not use the article's beam scanning technique that produces scan lines in the recrystallized silicon which are detrimental to spatial uniformity in their device unlike the processing procedure outlined in this and our copending laser processing applications where the beam is kept stationary. The teachings in our invention also allow improvements to their process by tailoring laser energy for profile customization to eliminate the additional steps for etching in addition to the other advantages of dark current improvements and defective pixel repair discussed here.

R. A. Stern, R. C. Catura, R. Kimble, A. F. Davidsen, M. Winzenread, M. M. Blouke, R. Hayes, D. M. Walton, J. L. Culhane, in "Ultraviolet and Extreme Ultraviolet Response of Charge-Coupled-Device Detectors", Optical Engineering, 26, 875–883 (1987) describe laser annealed backside illuminated CCDs. Once again there are substantial savings in processing steps in our invention, improvements to their process, and added benefits of pixel repair and improved dark current that are not disclosed in their paper. Stern et al. describe the ion implantation of $BF_2$, and pulsed laser annealing using a frequency-doubled Nd:YAG laser (at 530 nm). Although the pulsed laser technique used by Stern et al. here is superior to that used by Tassin et al. for the reasons described above, the use of a very shallow implant is not optimized by Stern et al.'s choice of a long laser wavelength as compared to the invention disclosed herein. There is substantial difference in absorption depth between Stern et al.'s wavelength of 540 nm and our use of 248 nm (excimer wavelengths of typically between 150 nm to 351 nm are useable, although shorter wavelengths could be used in accordance with this inventive concept). The shorter wavelength of our invention provides shallower penetration depth, lower energy requirements to melt the silicon, higher dopant concentrations and the subsequent improved responsivity over the prior art.

On page 877, section 2.2, paragraph 3 of this reference, Stern et al. discuss further processing (etching the annealed, thin backside membrane) to reestablish the high implant gradient at the back surface. This is again the result of the longer wavelength used by Stern et al., and adds to the complexity described above for Tassin et al. and compounded by the requirement that etching must be performed on thin (roughly 10 microns) of silicon. The extra steps involved in chemically etching the CCDs after laser activation significantly increases not only direct fabrication costs due to extra steps, but also the costs associated with yield losses of devices that have substantial investment of nearly complete fabrication prior to processing of the backside.

Stern et al. disclose on page 877, section 2.3, paragraph 2 that "Device characteristics such as . . . dark current . . . did not appear to differ significantly between untreated and ion-implanted devices". This is reiterated in their discussion on page 882, section 4 that ". . . device parameters such as dark current and readout noise, which are associated with the frontside circuitry, do not appear to be affected by the implant and laser anneal processing". On the other hand, this invention discloses a method whereby electrical activation is provided superior to that of conventional anneals such that a decrease in the standard deviation of the average dark current is obtained and in some cases a decrease in average dark current in the laser processed array. Furthermore, pixels that have dark current defects are repaired by our process as described hereafter. Not only are these significant improvements over the prior art, but they are unrecognized as possible effects since it was believed backside laser processing would not affect device parameters associated with the frontside circuitry as stated above. FIG. 4, page 878 of the Stern et al. reference shows a two dimensional image of their CCD readout, note the "numerous hole-like low signal areas". They "suggest that they are permanent imperfections in the thinned CCD"; however, defective pixels such as these have been repaired by our inventive process.

It is clear from the above references that there is keen interest in obtaining improved blue response in CCD imagers, and that the physics of the back surface dictate that creation of an electric field within the active volume of the detector to direct photogenerated charges toward the charge collection electrodes in the CCD is common for all techniques that exist in the art. Furthermore, apparent minor modifications in processing techniques in semiconductor fabrication can lead to major cost savings, yield and reliability improvements due to the large volume production and repetitive nature of processing. Extensive effort is placed on eliminating even one step from a process flow since each step has an associated yield. This is more important involving backside processing of CCDs since substantial fabrication costs and time are invested in the device by this step in the fabrication. Therefore, it will become apparent with the teachings contained herein for this invention for repair of defected pixels in addition to improving dark current and enhancing blue response simultaneously in one process using an excimer laser annealing process that a continuing need exists in the state of the art for this new method.

SUMMARY OF THE INVENTION

The present invention is directed to providing a low-temperature laser activation of implanted dopant or dopant incorporated from a gaseous ambient in a thin layer on the backside of a thinned CCD array.

An object of the invention is to provide for the activation of the implanted dopant on the backside of a thinned CCD array.

Another object is to provide a low-temperature laser activation of implanted dopants on the backside of a CCD device.

Another object is to provide a laser activation method for activation of implanted dopants on the backside of a CCD for improving dark current.

Another object is to provide a laser activation method for the repair of defective pixels of a CCD device.

Another object is to provide a laser activation method allowing the redistribution and/or activation of implanted dopants without subjecting the entire substrate to elevated temperatures.

Still another object is to provide a laser activation method permitting formation of a very high concentration, shallow and abrupt junction on a CCD device.

A further object is to provide a laser activation method allowing for masking to result in a patterned activation of a substrate.

Still another is to provide a laser activation method allowing the option of working with chips or package devices.

Still another object is to provide a laser activation method that allows the prepackaging of devices prior to laser treatment so that the fragile die are protected and can be thoroughly tested.

A further object is to provide a laser activation method which allows only devices which are successfully packaged and tested for illumination and activation.

Another object of the invention is to provide a low temperature laser process for photo incorporation of dopant from a gaseous ambient and simultaneous activation on the backside of a thinned CCD array.

These and other objects of the invention will become more readily apparent from the ensuing specification when taken in conjunction with the appended drawings.

DESCRIPTION OF THE PREFERRED EMBODIMENT

Figure 3:
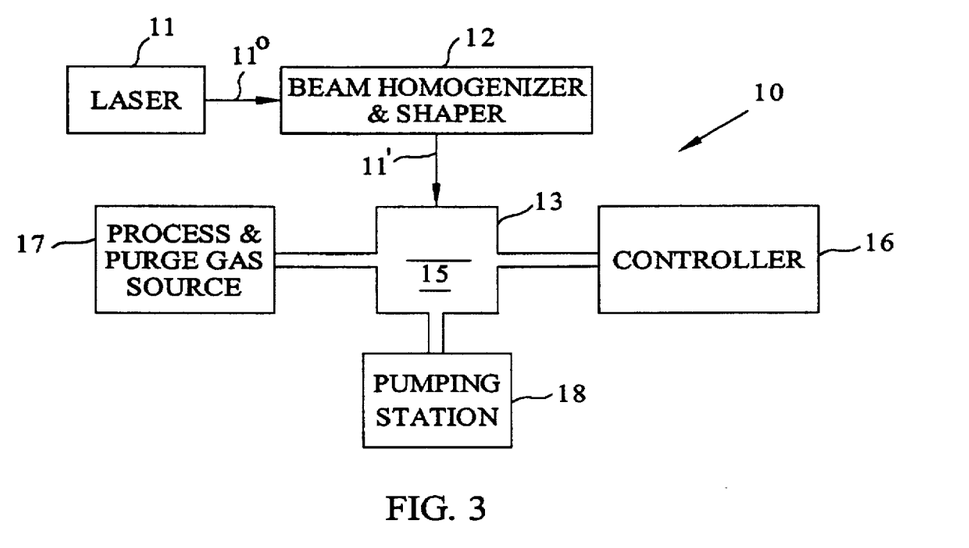
FIG. 3 schematically shows the processing setup used in accordance with this inventive concept.

Referring now to FIG. 3 of the drawings, a processor 10 assures an activation of a dopant ion implanted in a semiconductor substrate and/or the doping of a semiconductor substrate in an appropriate gaseous ambient in a manner which will improve the semiconductor's dark current and responsivity. A typical semiconductor substrate could be, but not limited to silicon, GaAs and other coumpound semiconductors etc. and may be configured like that portrayed in FIG. 1 which has a substrate S with a thinned portion S'.

Processor 10 includes an excimer laser 11 that emits its output beam 11° into a beam homogenizer and shaper 12 which assures that an appropriately homogenized and shaped beam 11' is directed into a processing chamber 13 and onto a sample 15 for processing. The homogenizer and shaper, such as that disclosed by Stephen D. Russell et al. in U.S. Pat. No. 4,932,747, homogenizes or uniformly distributes the intensity profile of beam 11 to have a substantially flat response across an area that covers sample 15. A gas mass flow controller system 16 controls the flow and pressurization of processing and purging gases from a process and purge gas source 17 in processing chamber 13 so that the processing of the sample can be accomplished in accordance with the method disclosed hereinafter. A pumping station 18 is coupled to the processing chamber to remove by-products of the processing. A full description of these constituents for effecting the activation of ion implanted dopants, or doping in a gaseous ambient, is elaborated on in the above referenced co-pending inventions and will make readily apparent an appreciation of the salient features of this inventive concept to those skilled in the art. The need has become apparent for improved dark current performance and blue response for CCD imagers. The device physics dictates that high concentration of p$^+$ dopants be used to prevent the trapping of photogenerated charges near the back surface of the CCD to be employed. Since this fact is well-known to those involved in this field of technology, a number of processing techniques have been investigated in order to implement the expected responsivity improvements. The improvement of this inventive concept optimizes the processing steps and techniques which are intimately tied to device processing yield, reliability, cost and viability. This improved method provides for activation by excimer laser 11 of ion implant dopant in the backside of a CCD array sample 15 and/or doping by excimer laser 11 of the backside of a CCD array sample 15 in a gaseous ambient. The laser more fully activates the dopant resulting in a significant reduction in the number of dark current defects, and improved dark current and blue response. Laser annealing in accordance with the processing technique of this inventive concept does not create excessive heat in the rest of a substrate and, therefore, is not prevented from making a more complete annealing. It is not subject to the same processing limitation mentioned in the Background of the Invention with respect to boron, because the laser processing technique of this inventive concept induces dramatic temperature rises only during a time duration of tens of nanoseconds and contained within a thin region on the back of sample 15. Processing parameters along with typical values are given in Table I:

TABLE I

| PROCESS PARAMETER | TYPICAL VALUE |
|---|---|
| implant dose | $5 \times 10^{13}$ ions/cm$^2$ |
| implant species | boron |
| implant depth | 120 nm |
| thermal anneal | 400° C., 30 min |
| gaseous ambient | helium |
| sample temperature | 10° C. |
| laser fluence | 1.0 J/cm$^2$ |
| laser wavelength | 248 nm |
| laser intensity profile | tophat, 10% uniformity |
| laser temporal profile | 23 ns |
| number of laser pulses | 10 | before and after laser treatment in accordance with this inventive concept. Samples which had failed dark current tests were stripped of their anti-reflective coating and retested. The samples were then appropriately illuminated and retested. Results are given in Table II and indicate a significant reduction in the number of defects observed in the POST as compared to the PRE laser treated samples. The terms "low", "total", and "fatal" are herein used to describe dark current densities greater than the mean array dark current by five, ten, and fifty nanoamps, respectively. Specifications as to the magnitude, number of allowed, and location of these dark current defects within a CCD array will vary for the particular application.

TABLE II

| SAMPLE # | LOW DEFECT | TOTAL DEFECT | FATAL DEFECT | AVE DRK CURRENT | STD DEV CURRENT | LASER ENERGY |
|---|---|---|---|---|---|---|
| #1 PRE | 13 | 14 | 5 | 8.5 | 3.11 | 0 |
| #1 POST | 4 | 3 | 1 | 8.8 | 0.83 | 1.1 |
| #2 PRE | 39 | 16 | 2 | 8.6 | 1.52 | 0 |
| #2 POST | 31 | 19 | 1 | 8.1 | 1.41 | 0 |
| #3 PRE | 20 | 4 | 0 | 9.4 | 0.68 | 0 |
| #3 POST | 1 | 0 | 0 | 9.5 | 0.41 | 0.8 |
| #4 PRE | 66 | 46 | 14 | 10.0 | 5.07 | 0 |
| #4 POST | 1 | 1 | 0 | 9.6 | 0.47 | 0.3 |

Figure 4:
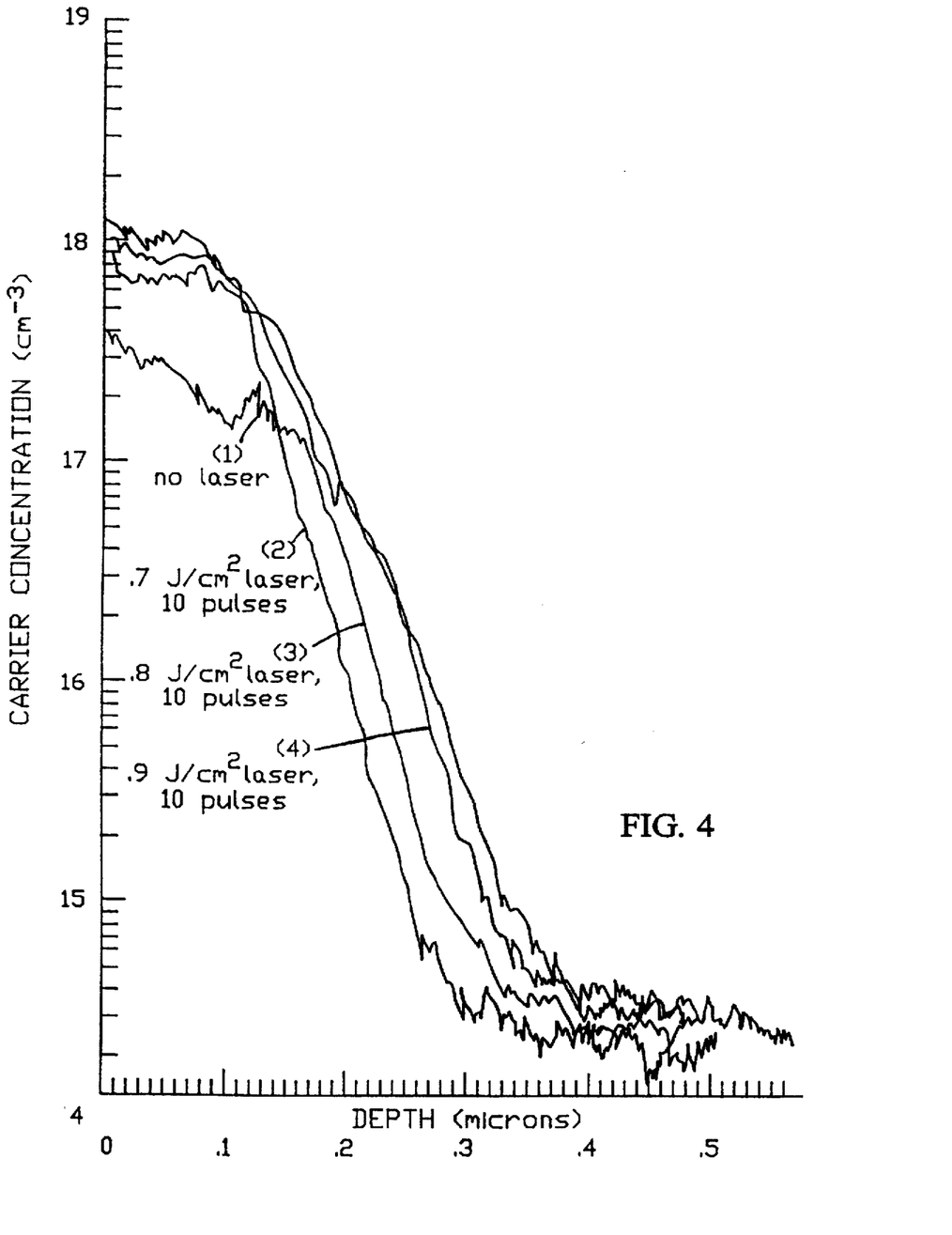
FIG. 4 depicts carrier concentration profiles for four samples which were all treated in the manner set forth in Table 1, with the exception of laser fluence.

FIG. 4 shows the electrically active charge carrier profiles of concentration versus depth obtained using the spreading resistance profiling technique for four individual samples which were all treated in the manner listed in Table 1, except for variations in laser fluence. The samples were silicon samples which are identical to those used in the fabrication of CCD arrays. An epitaxial layer had been implanted with $10^{13}$ ions/cm$^2$ and was annealed at 400° C. The samples were then placed in chamber 13 and illuminated by a beam 11' with a range of fluences and number of pulses using excimer laser 11 operating at 248 nm. Sample #1 was regarded as a control sample and received no laser pulses whatsoever. Samples #2, #3 and #4 were irradiated with laser fluences of 0.7, 0.8 and 0.9 J/cm$^2$, respectively. The sample #1 which has no laser activation showed approximately 10 to 20% boron activation while the laser activated samples #2, #3 and #4 exhibit approximately 100% activation. The other samples, samples #2 through #4, also indicate that profiles may be controlled by changes in laser fluence since the depth of active dopant distribution increases with laser pulse energy. The concentrations shown in FIG. 4 indicates that laser annealing results in an increase in the level of boron activation from about 20% to approximately 100%.

As indicated in FIG. 4, typical melt depths and the corresponding thin processed layer are on the order of 0.1 to 0.5 microns due to the shallow absorption depth of the UV wavelengths of the excimer laser (approximately 100 A° in silicon), and are a function of the laser fluence and optical, thermal properties of the sample.

CCD test devices were fabricated to examine the above effects on actual devices. CCDs subsequently identified as numbers 1, 2, 3 and 4 were examined under various laser conditions to examine part functionality and performance Detailed data analysis shows the average dark current of the samples varies with testing (note the control sample #2). However, there was a noticeable decrease in the standard deviation of the average dark current and a reduction in the total number of defects. Referral to Table III indicates that not only the number but the magnitude of the pixel defects was reduced.

TABLE III

LASER ANNEAL EVALUATION OF DARK CURRENT

Dark current mean of 8100 pixels:

| Pre-laser: | 9.95793 | Post-laser: | 9.657816 |
|---|---|---|---|

Dark current mean of 7052 pixels:

| Rows | 3 to 88 | Columns | 5 to 86 |
|---|---|---|---|
| Pre-laser: | 9.969242 | Post-laser: | 9.594448 |
| Standard Deviation: | | | |

| Prelaser Overall: | 4.826055 | Checked | 5.126414 |
|---|---|---|---|
| Postlaser Overall: | .8119957 | Checked | .4537418 |

Failure distribution (nA)

| | low | total | fatal |
|---|---|---|---|
| prelaser | 66 | 46 | 14 |
| postlaser | 1 | 1 | 0 |

*** Mean + 5 nA range Prelaser Failures ***

| PIXEL | PRE | POST |
|---|---|---|
| 8 14 | 15.9755 | 10.58907 |
| 9 51 | 18.24071 | 10.68361 |
| 10 13 | 18.06182 | 10.39991 |
| 12 57 | 16.89952 | 10.14779 |
| 13 9 | 15.1112 | 10.49445 |
| 15 5 | 17.10811 | 10.5575 |
| 17 61 | 15.55824 | 9.89566 |

TABLE III-continued

LASER ANNEAL EVALUATION OF DARK CURRENT

| | | |
|---|---|---|
| 18 63 | 15.49861 | 9.70659 |
| 22 21 | 16.48217 | 9.35992 |
| 25 67 | 15.46875 | 9.92714 |
| 26 22 | 16.4524 | 9.58048 |
| 27 66 | 15.76691 | 9.80112 |
| 32 21 | 15.31979 | 9.35992 |
| 36 13 | 15.31979 | 9.42298 |
| 36 15 | 15.43906 | 9.67502 |
| 39 9 | 15.88609 | 9.23382 |
| 39 11 | 16.66099 | 9.35992 |
| 40 60 | 17.61478 | 9.42298 |
| 42 9 | 16.95907 | 9.48603 |
| 42 63 | 15.20053 | 9.29695 |
| 43 62 | 19.93954 | 9.51743 |
| 45 8 | 18.71753 | 10.17936 |
| 47 68 | 15.82646 | 9.48603 |
| 47 69 | 16.24381 | 9.42298 |
| 49 5 | 17.61478 | 9.73807 |
| 50 63 | 19.25406 | 9.45446 |
| 50 71 | 17.37633 | 9.80112 |
| 52 70 | 16.72062 | 9.42298 |
| 53 5 | 15.43906 | 10.17927 |
| 56 67 | 15.76683 | 10.08473 |
| 61 69 | 16.03505 | 9.80112 |
| 64 5 | 19.55214 | 10.21084 |
| 66 6 | 16.4524 | 10.08473 |
| 66 66 | 18.15123 | 9.07631 |
| 66 67 | 18.68775 | 9.45446 |
| 68 65 | 18.00227 | 9.1078 |
| 68 66 | 15.43898 | 9.39141 |
| 69 64 | 18.83671 | 9.26539 |
| 70 62 | 15.28994 | 9.29687 |
| 71 62 | 15.43898 | 9.48603 |
| 71 63 | 15.52846 | 9.58048 |
| 74 10 | 15.52838 | 9.86418 |
| 75 9 | 15.4092 | 10.1163 |
| 75 60 | 16.63121 | 9.42298 |
| 76 49 | 18.3599 | 9.6751 |
| 77 9 | 15.05149 | 10.27381 |
| 77 54 | 16.03513 | 9.51751 |
| 77 56 | 18.89643 | 9.83261 |
| 77 58 | 16.48217 | 9.45446 |
| 78 55 | 15.31979 | 9.39141 |
| 78 63 | 19.76073 | 9.45455 |
| 79 11 | 15.58802 | 10.30538 |
| 79 12 | 16.21387 | 9.89575 |
| 79 13 | 17.28692 | 9.73807 |
| 79 55 | 18.00227 | 9.39141 |
| 80 52 | 17.01862 | 9.26539 |
| 81 13 | 15.4092 | 10.33695 |
| 83 18 | 15.46883 | 10.39991 |
| 84 43 | 16.78025 | 9.32844 |
| 84 50 | 15.14098 | 9.95863 |
| 84 51 | 15.05157 | 9.32844 |
| 85 20 | 16.98884 | 9.83261 |
| 85 23 | 16.42254 | 9.73807 |
| 85 29 | 15.31979 | 9.73807 |
| 85 33 | 16.03505 | 9.58048 |
| 86 25 | 15.05149 | 9.70659 |

*** Mean + 10 nA range Prelaser Failures ***

| | | |
|---|---|---|
| 10 52 | 25.93043 | 10.36835 |
| 13 12 | 21.72786 | 10.11622 |
| 15 7 | 20.89325 | 10.68361 |
| 19 62 | 23.93344 | 9.89566 |
| 20 62 | 22.92002 | 9.67502 |
| 25 66 | 27.62925 | 9.73807 |
| 26 23 | 22.20475 | 9.54908 |
| 26 66 | 21.54904 | 9.35992 |
| 28 68 | 24.32093 | 9.89566 |
| 29 56 | 22.71142 | 9.9902 |
| 31 22 | 28.434 | 9.48594 |
| 34 17 | 24.73819 | 9.26539 |
| 40 11 | 20.68466 | 9.549 |
| 40 72 | 23.27773 | 9.64362 |
| 41 9 | 25.3939 | 9.86418 |
| 43 8 | 39.1936 | 9.58057 |
| 43 9 | 25.60257 | 9.9902 |
| 52 75 | 49.20807 | 9.39141 |
| 57 70 | 22.68165 | 9.45455 |
| 60 69 | 23.51618 | 9.83269 |
| 66 5 | 21.37023 | 10.14787 |
| 69 63 | 21.34045 | 9.07631 |
| 70 64 | 41.48867 | 9.39141 |
| 72 64 | 26.43702 | 9.2339 |
| 73 65 | 26.37747 | 9.58057 |
| 75 8 | 41.90593 | 10.1163 |
| 76 9 | 29.53675 | 10.17927 |
| 76 58 | 23.09891 | 9.549 |
| 76 60 | 20.35689 | 9.58057 |
| 78 56 | 24.88715 | 9.29695 |
| 78 58 | 21.81727 | 9.67502 |
| 79 58 | 25.69198 | 9.45446 |
| 80 12 | 22.38357 | 10.14779 |
| 80 13 | 34.63348 | 9.76956 |
| 81 52 | 46.34686 | 9.42298 |
| 81 53 | 39.28309 | 9.26539 |
| 82 13 | 22.89032 | 10.27381 |
| 82 15 | 29.03008 | 10.36835 |
| 83 16 | 26.2582 | 9.92714 |
| 83 19 | 38.80611 | 10.17927 |
| 83 47 | 44.49892 | 9.20233 |
| 83 48 | 46.73427 | 9.64353 |
| 84 41 | 21.51919 | 9.58057 |
| 84 49 | 23.09891 | 9.83269 |
| 85 24 | 21.34037 | 9.92714 |
| 85 50 | 22.08557 | 10.02177 |

*** 50 and greater nA range Prelaser Failures ***

| | | |
|---|---|---|
| 19 63 | 50.37046 | 10.14779 |
| 49 71 | 170.0973 | 11.25083 |
| 76 8 | 50.37053 | 10.21084 |
| 76 54 | 147.2667 | 13.74045 |
| 81 15 | 201.7204 | 11.12473 |
| 82 49 | 64.82595 | 10.87268 |
| 82 50 | 156.9235 | 19.6653 |
| 82 51 | 112.9014 | 12.25926 |
| 83 46 | 52.36744 | 9.58057 |
| 83 49 | 60.08693 | 10.62047 |
| 83 50 | 113.0505 | 14.9696 |
| 83 51 | 119.7268 | 13.8035 |
| 84 46 | 75.46635 | 9.48594 |
| 85 43 | 107.2087 | 9.89575 |

*** Mean + 5 nA Postlaser Failures **

| | | |
|---|---|---|
| 83 50 | 113.0505 | 14.9696 |

** Mean + 10 nA Postlaser Failures **

| | | |
|---|---|---|
| 82 50 | 156.9235 | 19.6653 |

A die which had marginally failed dark current specifications has been made a functional die with this laser annealing technique, see sample 3-PRE as compared to the same sample as 3-POST in Table II. Repairs of marginal or defective pixels in an otherwise marginal sample are made with the process of this inventive concept. In other words, the laser annealing of the backside implant results in defect reductions.

Referring to the tabulated data of Tables II and III, graphic proof of the capability of this invention is demonstrated. Tables show that this invention repairs and makes serviceable a typical (not best case) laser annealed sample of a 90 by 90 pixel CCD array. The inventive process disclosed herein is not, however, limited to devices of this size but may be modified by one skilled in the art to accommodate any sized array.

The particular array portrayed, #3, was chosen due to the unique spiral defect structure which was "repaired" by laser illumination. It will be noted that all defective pixels were improved, most to within acceptable limits. Also, the mean dark current and standard deviation were decreased.

The short wavelength of the beam emitted by the excimer laser is absorbed in thin layer (on the order of 100 A) allowing very shallow anneals and recrystallizations to be performed. The depth of the recrystallizations and/or anneals (one does not necessarily have to melt in anneal in this process) is related to the laser fluence and pulse duration. Lasers emitting wavelengths of light which have much larger penetration depths cannot produce as shallow an activated or redistributed dopant profile.

An alternative method to implant activation is through modifications to the prior art of gas immersion laser doping (GILD) reported in the above referenced work of Weiner et al. The GILD technique has been applied in the fabrication of semiconductor devices but not in the application or manner envisaged herein. The process would entail the use of a doping ambient such as boron trifluoride, arsine, or other ambients possessing doping constituents which may be suitably incorporated into the sample by this process by one skilled in the art in chamber 13. Ambient dopant is adsorbed onto the sample substrate and upon melting is incorporated into the crystal lattice of the backside of the illuminated device. The dopant concentration and profile obtained would be a function of the number of laser pulses delivered in the presence of the dopant gas, the energy of the pulses, the percentage coverage of the dopant gas on the sample substrate, etc. The optimum doping profile for blue response enhancement has the maximum dopant concentration at the backside surface of the CCD as discussed in the Background of the Invention. This profile could be obtained by simply reducing the laser energy during the course of the dopant incorporation process resulting in lower melt depths and causing shallower regions to have higher dopant concentrations. Further possible benefits of the gas phase doping approach are the elimination of ion implantation crystal damage, elimination of the ion implantation step and the related device handling, as well as the possibility of obtaining much higher doping concentrations without the crystal damage normally associated with them.

Obviously, many modifications and variations of the present invention are possible in the light of the above teachings. It is therefore to be understood that within the scope of the appended claims, the invention may be practiced otherwise than as specifically described.

We claim:

1. A method of effecting a dopant concentration in a CCD formed on a substrate for enhancing spectral response and reducing dark current a pixel array of the CCD comprising the steps of:

introducing a dopant at a back surface of the substrate;

illuminating the back surface of the substrate with a beam of energy pulses having a substantially homogeneous intensity over the pixel array and an appropriate wavelength to activate the dopant in a region extending from the back surface of the substrate to the pixel array and to form a concentration of activated dopant within the region that is highest at the back surface of the substrate and decreases with depth; and maintaining the CCD at a temperature to avoid heating the substrate outside the region of activated dopant during the step of illuminating the back surface of the substrate.

2. The method of claim 1 wherein:

the step of introducing a dopant comprises ion implantation to effect the concentration of activated dopant; and the energy pulses in the beam illuminating the back surface of the substrate have a substantially constant energy level.

3. The method of claim 1 wherein:

the step of introducing a dopant includes gas immersion laser doping; and the energy pulses in the beam illuminating the back surface of the substrate have a varying energy level to effect the concentration of activated dopant.

4. The method of claim 1 wherein:

the CCD is maintained at a temperature of substantially 10° C. during the step of illuminating the back surface of the CCD.

5. The method of claim 1 wherein the wavelength of the energy pulses has a value between 150 and 351 nm.

* * * * *